United States Patent
Yang et al.

(10) Patent No.: US 9,905,597 B2
(45) Date of Patent: Feb. 27, 2018

(54) SENSOR PACKAGE STRUCTURE

(71) Applicant: KINGPAK TECHNOLOGY INC., Hsin-Chu County (TW)

(72) Inventors: Jo-Wei Yang, Hsin-Chu County (TW); Chung-Hsien Hsin, Hsin-Chu County (TW); Ming-Hui Chen, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 0 days.

(21) Appl. No.: 15/647,465

(22) Filed: Jul. 12, 2017

(65) Prior Publication Data
US 2018/0019274 A1   Jan. 18, 2018

Related U.S. Application Data

(60) Provisional application No. 62/361,071, filed on Jul. 12, 2016.

(51) Int. Cl.
| | |
|---|---|
| *H01L 21/00* | (2006.01) |
| *H01L 27/146* | (2006.01) |
| *H01L 33/48* | (2010.01) |
| *H01L 25/16* | (2006.01) |

(52) U.S. Cl.
CPC ...... *H01L 27/14618* (2013.01); *H01L 33/483* (2013.01); *H01L 25/167* (2013.01)

(58) Field of Classification Search
CPC ............. H01L 27/14618; H01L 33/483; H01L 25/167
See application file for complete search history.

(56) References Cited

U.S. PATENT DOCUMENTS

| | | | | |
|---|---|---|---|---|
| 6,130,448 A | * | 10/2000 | Bauer ................. | H01L 31/0203 257/215 |
| 6,492,699 B1 | * | 12/2002 | Glenn ............... | H01L 27/14618 257/433 |
| 2017/0345731 A1 | * | 11/2017 | Chiang ............... | H01L 23/3107 |

* cited by examiner

*Primary Examiner* — Richard Booth
(74) *Attorney, Agent, or Firm* — Li & Cai Intellectual Property (USA) Office

(57) ABSTRACT

A sensor package structure includes a substrate, a sensing member, a shielding member, a metallic wire, and an encapsulating compound. The substrate includes a die bonding zone and a wiring zone. The sensing member is mounted on the die bonding zone and includes a sensing zone, a carrying zone arranged around the sensing zone, and a connecting zone arranged outside of the carrying zone. The shielding member includes a translucent covering portion and a supporting portion connected to a peripheral portion of the covering portion. The supporting portion having a coefficient of thermal expansion less than 10 ppm/° C. is fixed on the carrying zone. The metallic wire connects the wiring zone and the connecting zone. The encapsulating compound is disposed on the wiring zone and covers a peripheral side of the sensing member, the connecting zone, and a peripheral side of the shielding member.

13 Claims, 7 Drawing Sheets

SENSOR PACKAGE STRUCTURE

BACKGROUND OF THE INVENTION

1. Field of the Invention

The present disclosure relates to a package structure; in particular, to a sensor package structure.

2. Description of Related Art

In order to effectively increase sensing sensitivity of an image sensor (e.g., CMOS or CCD), the image sensor needs to be improved for pixel, light sensitivity, and logic processing requirements. The size of sensor die becomes larger and larger (e.g., 10 mm×10 mm, 14 mm×14 mm, 16 mm×16 mm, or 19 mm×19 mm) for providing a sensing performance with a high quality.

However, the sensor die having a large size is encapsulated in a conventional sensor package structure, so that the conventional sensor package structure is formed with a large size. Thus, when the surrounding temperature is changed, the conventional sensor package structure suffers larger warpage and larger stress than small size package structure. Therefore, large format package with the conventional sensor package structure has poor reliability capability.

SUMMARY OF THE INVENTION

The present disclosure provides a sensor package structure to effectively improve the drawbacks associated with conventional sensor package structures.

The present disclosure discloses a sensor package structure including a substrate, a sensing member, a shielding member, at least one metallic wire, and an encapsulating compound. The substrate has an upper surface and a lower surface opposite to the upper surface. The upper surface of the substrate includes a die bonding zone and a wiring zone arranged outside of the die bonding zone. The sensing member is mounted on the die bonding zone of the substrate. A top surface of the sensing member arranged distant from the substrate includes a sensing zone, a carrying zone having a ring shape and arranged around the sensing zone, and a connecting zone arranged outside of the carrying zone. The shielding member includes a translucent covering portion and a ring-shaped supporting portion connected to a peripheral portion of the covering portion. The supporting portion having a coefficient of thermal expansion less than 10 ppm/° C. is fixed on the carrying zone of the sensing member. The shielding member and the top surface of the sensing member surroundingly co-define an enclosed accommodating space, and the sensing zone is arranged in the accommodating space. The at least one metallic wire has two opposite ends. The two ends of the at least one metallic wire are respectively connected to the wiring zone of the substrate and the connecting zone of the sensing member to establish an electrical connection between the substrate and the sensing member. The encapsulating compound is disposed on the wiring zone and covers a peripheral side of the sensing member, the connecting zone, and a peripheral side of the shielding member. The at least one metallic wire is embedded in the encapsulating compound.

Exemplarily, the supporting portion is translucent, the supporting portion and the covering portion have the same coefficient of thermal expansion, and the supporting portion is adhered to or integrally formed on the covering portion.

Exemplarily, a peripheral side of the covering portion does not protrude out of that of the supporting portion.

Exemplarily, the encapsulating compound includes a liquid compound, and a top surface of the liquid compound is in an arc shape. The top surface of the liquid compound and an upper surface of the covering portion are formed with a cut angle within a range of 0~60 degrees.

Exemplarily, the sensor package structure further includes a blocking member. The blocking member is disposed on the upper surface of the covering portion and is arranged inside of the peripheral side of the covering portion by a predetermined distance. A portion of the upper surface of the covering portion arranged between the peripheral side of the covering portion and the blocking member is defined as an attaching zone. The encapsulating compound further includes a molding compound formed on the top surface of the liquid compound and the attaching zone.

Exemplarily, the attaching zone is arranged in a projecting region defined by orthogonally projecting the supporting portion onto the upper surface of the covering portion, and a width of the supporting portion is within a range of 0.5~2 mm.

Exemplarily, the coefficient of thermal expansion of the supporting portion is within a range of 2.6~7.2 ppm/° C.

Exemplarily, a height of the supporting portion is more than or equal to 300 μm.

Exemplarily, a height of the shielding member is 40~80% of a height of the sensor package structure.

The present disclosure also discloses a substrate, a sensing member, a shielding member, at least one metallic wire, and an encapsulating compound. The substrate has an upper surface and a lower surface opposite to the upper surface. The upper surface of the substrate includes a die bonding zone and a wiring zone arranged outside of the die bonding zone. The sensing member has a width more than or equal to 10 mm and mounted on the die bonding zone of the substrate. A top surface of the sensing member arranged distant from the substrate includes a sensing zone, a carrying zone having a ring shape and arranged around the sensing zone, and a connecting zone arranged outside of the carrying zone. The shielding member includes a translucent covering portion and a ring-shaped supporting portion connected to a peripheral portion of the covering portion. The supporting portion having a height more than or equal to 300 μm is fixed on the carrying zone of the sensing member. The shielding member and the top surface of the sensing member surroundingly co-define an enclosed accommodating space, and the sensing zone is arranged in the accommodating space. The at least one metallic wire has two opposite ends. The two ends of the at least one metallic wire are respectively connected to the wiring zone of the substrate and the connecting zone of the sensing member to establish an electrical connection between the substrate and the sensing member. The encapsulating compound is disposed on the wiring zone and covers a peripheral side of the sensing member, the connecting zone, and a peripheral side of the shielding member, wherein the at least one metallic wire is embedded in the encapsulating compound.

Exemplarily, the supporting portion is translucent, the supporting portion and the covering portion have the same coefficient of thermal expansion, and the supporting portion is adhered to or integrally formed on the covering portion.

Exemplarily, a peripheral side of the covering portion does not protrude out of that of the supporting portion.

Exemplarily, a height of the shielding member is 40~80% of a height of the sensor package structure.

In summary, the sensor package structure of the present disclosure is provided with a good structural strength by the shielding member, thereby effectively avoiding a warping problem and increasing the reliability of the sensor package structure.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Reference is made to FIGS. 1 to 7, which illustrate the present disclosure. References are hereunder made to the detailed descriptions and appended drawings in connection with the present disclosure. However, the appended drawings are merely provided for exemplary purposes, and should not be construed as restricting the scope of the present disclosure.

First Embodiment

Figure 1:
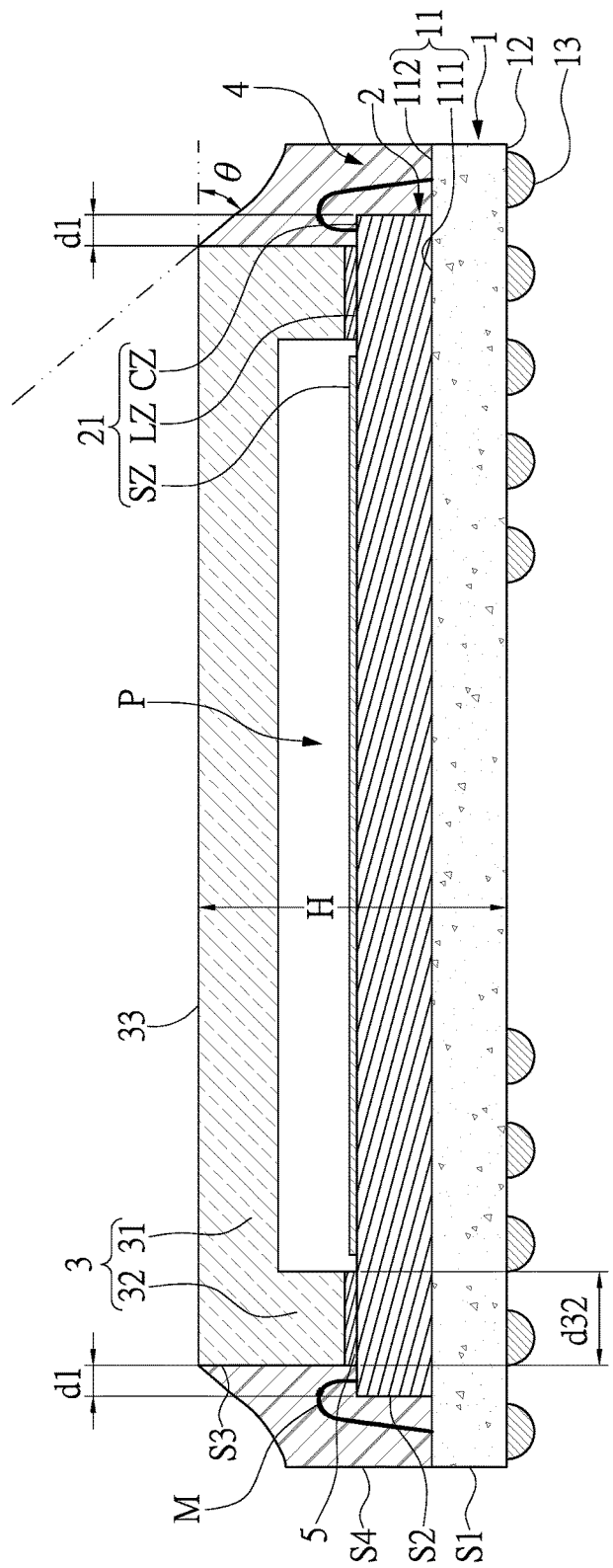
FIG. 1 is a cross-sectional view showing a sensor package structure according to a first embodiment of the present disclosure.

Reference is made to FIG. 1, which illustrates a cross-sectional view of a sensor package structure according to a first embodiment of the present disclosure. The sensor package structure in the present embodiment includes a substrate 1, a sensing member 2 (e.g., an image sensor die), a shielding member 3, and an encapsulating compound 4 (e.g., a liquid compound and/or a molding compound). The substrate 1 has an upper surface 11 and a lower surface 12 opposite to the upper surface 11. The sensing member 2 is disposed on the upper surface 11 of the substrate 1. The shielding member 3 is disposed on the sensing member 2. The encapsulating compound 4 is disposed on the substrate 1 and is configured to seal around the shielding member 3. Incidentally, a thickness of the sensor package structure can be within a range of 1.5~2.5 mm.

The sensing member 2 can be disposed on the upper surface 11 of the substrate 1 by using an adhering manner or other fixing manners (e.g., a soldering manner). The substrate 1 includes at least one conductive terminal 13. In the present embodiment, each of the conductive terminals 13 can be a solder ball, and the conductive terminals 13 can be arranged on the lower surface 12 of the substrate 1 to form a ball grid array (BGA). In addition, the substrate 1 can be a plastic substrate, a glass substrate, or other substrates made of different materials, but the present disclosure is not limited thereto.

Specifically, the upper surface 11 of the substrate 1 includes a die bonding zone 111 and a wiring zone 112 arranged outside of the die bonding zone 111. The wiring bonding zone 112 is preferably in a ring shape and is arranged around the die bonding zone 111, but the present disclosure is not limited thereto. For example, in other embodiments of the present disclosure, the wiring zone 112 can be two straight shapes respectively arranged at two opposite outer sides of the die bonding zone 111.

The sensing member 2 has a sensing zone SZ and a connecting zone CZ arranged close to the sensing zone SZ. The sensing member 2 can be a sensor die (e.g., an optical sensor die, an image sensor die, or other sensor dies). The sensing member 2 can be a large scale die, which is larger than or identical to a size of 10 mm×10 mm. For example, the size of the sensing member 2 can be 11 mm×11 mm, 14 mm×14 mm, 16 mm×16 mm, or 19 mm×19 mm.

Specifically, the sensing member 2 in the present embodiment has a width which is preferably more than or equal to 10 mm, and the sensing member 2 is mounted on the die bonding zone 111 of the substrate 1. A top surface 21 of the sensing member 2 arranged distant from the substrate 1 includes the sensing zone SZ, a carrying zone LZ having a ring shape and arranged around the sensing zone SZ, and the connecting zone CZ arranged outside of the carrying zone LZ. The connecting zone CZ is preferably in a ring shape and is arranged around the carrying zone LZ, but the present disclosure is not limited thereto. For example, in other embodiments of the present disclosure, the connecting zone CZ can be two straight shapes respectively arranged at two opposite outer sides of the carrying zone LZ.

The shielding member 3 is disposed on the sensing member 2, and an accommodating space P is surroundingly formed by the shielding member 3 and the top surface 21 of the sensing member 2. Specifically, the shielding member 3 includes a covering portion 31 and a supporting portion 32 connected to a peripheral portion of the covering portion 31, and the covering portion 31 is arranged above the sensing zone SZ. Moreover, the shielding member 3 is fixed on the sensing member 2 by using an adhesive layer 5 to bond the supporting portion 32 to the sensing member 2. The adhesive layer 5 can be a light-curable adhesive, a heat-curable adhesive, or a mixed adhesive, the latter one of which has the light-curable adhesive and the heat-curable adhesive, but the present disclosure is not limited thereto.

Incidentally, a width d32 of the supporting portion 32 in the present embodiment is approximately within a range of 0.5~2 mm. Thus, compared to other structures (e.g., a thin glass), the supporting portion 32 in the present embodiment having the larger width d32 can be configured to support the covering portion 31, so that the shielding member 3 is provided with a better structural strength for preventing the covering portion 31 from warping or stress concentration. Moreover, the wider the width d32 of the supporting portion 32 is, the better effect on the stress reduction for the covering portion 31 can be achieved. In the present embodiment, the covering portion 31 and the supporting portion 32 of the shielding member 3 are integrally formed as one piece, and the shielding member 3 is made of a rigid material having a coefficient of thermal expansion (CTE) within a range of 2~10 ppm/° C. (e.g., a glass material has CTE of 7.2 ppm/° C. or a silicon material has CTE of 2.6 ppm/° C.).

Specifically, the covering portion 31 is translucent (e.g., transparent), and the supporting portion 32 having a ring shape is connected to a peripheral portion of the covering portion 31. The CTE of the supporting portion 32 is less than 10 ppm/° C. (i.e., 2.6~7.2 ppm/° C. is preferable). The supporting portion 32 is fixed on the carrying zone LZ of the sensing member 2, so that the shielding member 3 and the top surface 21 of the sensing member 2 surroundingly co-define the accommodating space P, and the sensing zone SZ is arranged in the accommodating space P.

Moreover, in the present embodiment, the supporting portion 32 is translucent, the supporting portion 32 and the covering portion 31 have the same CTE, and are integrally formed as one piece. A peripheral side of the covering portion 31 does not protrude out of a peripheral side of the supporting portion 32 (i.e., the peripheral side of the covering portion 31 is coplanar with the peripheral side of the supporting portion 32), but the present disclosure is not limited thereto. For example, in other embodiments of the present disclosure, the peripheral side of the covering portion 31 can be arranged inside of the peripheral side of the supporting portion 32 by a distance.

In addition, the height of the supporting portion 32 in the present embodiment is more than or equal to 300 μm. In other words, the height of the shielding member 3 is preferably 40~80% of a height H of the sensor package structure, which excludes a height of each conductive terminal 13.

As shown in FIG. 1, the supporting portion 32 is disposed on the sensing member 2, and the peripheral side of the supporting portion 32 and the peripheral side S2 of the sensing member 2 have a first predetermined distance d1 there-between. A portion of the top surface 21 of the sensing member 2 corresponding in position to the first predetermined distance d1 is defined as the connecting zone CZ. In the present embodiment, a metallic wire M connects the connecting zone CZ of the sensing member 2 and the substrate 1, thereby electrically connecting the sensing member 2 to the substrate 1. In other words, the sensor package structure includes at least one of metallic wire M having two opposite ends, and the two ends of the at least one metallic wire M are respectively connected to the wiring zone 112 of the substrate 1 and the connecting zone CZ of the sensing member 2, thereby establishing an electrical connection between the substrate 1 and the sensing member 2.

The encapsulating compound 4 is disposed on the substrate 1, and a peripheral side S4 of the encapsulating compound 4 is coplanar with a peripheral side S1 of the substrate 1. The encapsulating compound 4 covers entirely the connecting zone CZ of the sensing member 2, and is configured to seal around the supporting portion 32. Moreover, the encapsulating compound 4 can be made of an opaque material, thereby preventing light from entering into the sensing member 2. The encapsulating compound 4 in the present embodiment is a liquid compound. The liquid compound is arranged around and seamlessly seals the substrate 1, the sensing member 2, and the shielding member 3 to establish a firm connection there-between. A top surface of the encapsulating compound 4 is in an arc shape, and the top surface of the encapsulating compound 4 and an upper surface 33 of the covering portion 3 are formed with a cut angle θ within a range of 0~60 degrees.

Specifically, the encapsulating compound 4 is disposed on the wiring zone 112 of the substrate 1 and covers the peripheral side S2 of the sensing member 2, the connecting zone CZ, and the peripheral side S3 of the shielding member 3. The at least one metallic wire M is embedded in the encapsulating compound 4.

Second Embodiment

Figure 2:
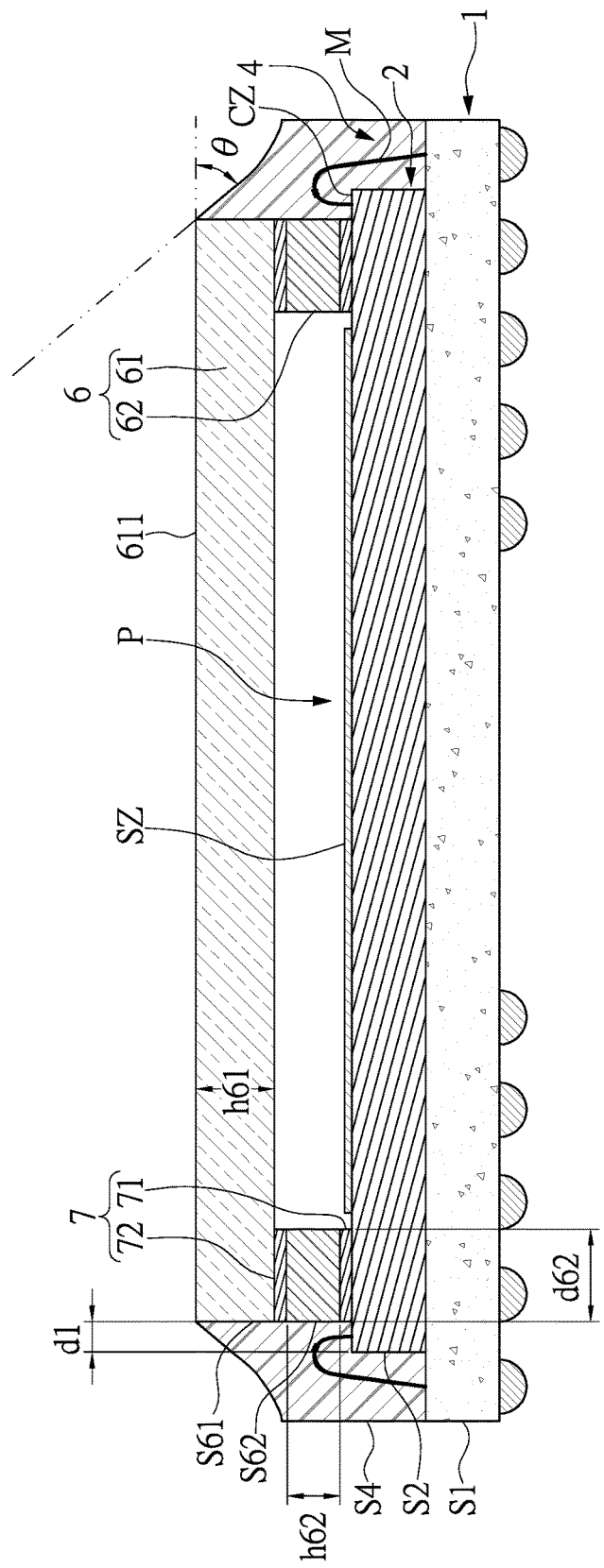
FIG. 2 is a cross-sectional view showing the sensor package structure according to a second embodiment of the present disclosure.

Reference is made to FIG. 2, which illustrates a cross-sectional view of the sensor package structure according to a second embodiment of the present disclosure. The sensor package structure in the present embodiment, which includes the substrate 1, the sensing member 2, and the encapsulating compound 4, is similar to the sensor package structure of the first embodiment. The difference between the present embodiment and the first embodiment is disclosed as follows. The shielding member 6 in the present embodiment includes a support 62 (e.g., a dam) and a cover 61 (e.g., a transparent window). The support 62 is disposed on the sensing member 2, and the cover 61 is disposed on the support 62. The encapsulating compound 4 is disposed on the substrate 1, and is configured to seal around the support 62 and the cover 61. It should be noted that the cover 61 in the present embodiment can be named as a covering portion 61, and the support 62 in the present embodiment can be named as a supporting portion 62.

The cover 61 is disposed on the support 62. The material of the cover 61 can be a glass, a transparent PMMA, or other translucent materials (e.g., an optical glass or a glass with coating layer). Specifically, the cover 61 is adhered to the sensing member 2 by using a second adhesive layer 72, and the second adhesive layer 72 can be a light-curable adhesive, a heat-curable adhesive, or a mixed adhesive, the latter one of which has the light-curable adhesive and the heat-curable adhesive. Incidentally, an adhesive layer 7 in the present embodiment includes a first adhesive layer 71 and the second adhesive layer 72, which are made of the same material for being used to implement the manufacturing process more easily.

The support 62 is disposed on the sensing member 2 and is arranged around the sensing zone SZ. Specifically, the support 62 is adhered to the sensing member 2 by using the first adhesive layer 71, and the first adhesive layer 71 can be a light-curable adhesive, a heat-curable adhesive, or a mixed adhesive, the latter one of which has the light-curable adhesive and the heat-curable adhesive. A width d62 of the support 62 is substantially within a range of 0.5~2 mm, so that the support 62 can provide an area which is enough for being adhered to the sensing 2 and the cover 61, and the shielding member 6 can be provided with a better structural strength for preventing the cover 61 from warping or stress concentration.

Specifically, the support 62 having a fixed height is arranged around the sensing member 2 to separate the cover 61 from the sensing member 2 for forming an accommodating space P, thereby preventing external particles polluting the sensing zone SZ of the sensing member 2. Moreover, the height h62 of the support 62 can be more than or equal to one third of a height h61 of the cover 61 (e.g., the height h62 of the support 62 can be more than 300 μm, even more than 500 μm), so that particles located in the sensing zone SZ do not obviously affect an image generated from the sensor package structure, thereby increasing the yield of the sensor package structure. Furthermore, the support 62 can be made of a rigid material having a coefficient of thermal expansion (CTE) within a range of 2~10 ppm/° C. (e.g., a glass material has CTE of 7.2 ppm/° C. or a silicon material has CTE of 2.6 ppm/° C.). In the present embodiment, the support 62 and the cover 61 can be provided with the same CTE or the similar CTE for CTE mismatch decreasing, and the support 62 is not easily deformed by heating. The supporting 62 is provided with a fixed height to maintain that the cover 61 is parallel to the sensing member 2, so that the sensing zone SZ can receive light more uniformly to increase an imaging performance.

As shown in FIG. 2, the support 62 is disposed on the sensing member 2, and a peripheral side S62 of the support 62 and a peripheral side S2 of the sensing member 2 have a first predetermined distance d1 there-between. A portion of the top surface 21 of the sensing member 2 corresponding in position to the first predetermined distance d1 is defined as the connecting zone CZ. In the present embodiment, at least one metallic wire M connects the connecting zone CZ of the sensing member 2 and the substrate 1, thereby electrically connecting the sensing member 2 to the substrate 1.

The encapsulating compound 4 is disposed on the substrate 1, and a peripheral side S4 of the encapsulating compound 4 is coplanar with a peripheral side S1 of the substrate 1. The encapsulating compound 4 covers entirely the connecting zone CZ of the sensing member 2, and is configured to seal around the support 62 and the cover 61. In the present embodiment, the peripheral side S62 of the support 62 is flush with a peripheral side S61 of the cover 61, so that the encapsulating compound 4 cannot flow to a position under the cover 61, thereby preventing stress, which is generated from the expansion and contraction of the encapsulating compound 4, from being applied to the cover 61. In other embodiments of the present disclosure, the peripheral side S62 of the support 62 and the peripheral side S61 of the cover 61 have an inward distance (not shown) there-between, so that the encapsulating compound 4 is disposed around a region of the shielding member 3 corresponding in position to the inward distance, thereby preventing moisture seeping into the accommodating space P. Moreover, the encapsulating compound 4 can be made of an opaque material, thereby preventing light entering into the sensing member 2 through the support 62. The encapsulating compound 4 in the present embodiment is a liquid compound. The liquid compound is arranged around and seamlessly seals the substrate 1, the sensing member 2, the support 62, and the cover 61 to establish a firm connection there-between. A top surface of the encapsulating compound 4 is in an arc shape, and the top surface of the encapsulating compound 4 and an upper surface 611 of the cover 61, the latter one of which is a curved surface, are formed with a cut angle θ within a range of 0~60 degrees.

Third Embodiment

Figure 3:
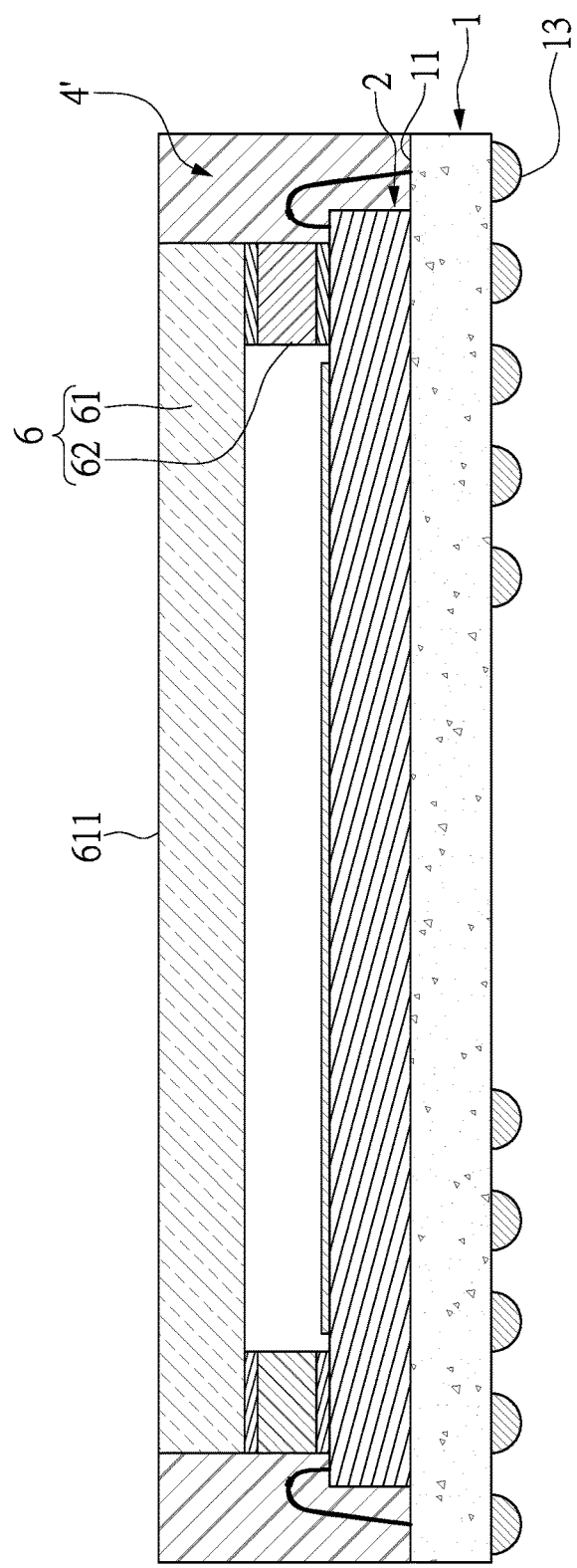
FIG. 3 is a cross-sectional view showing the sensor package structure according to a third embodiment of the present disclosure.

Reference is made to FIG. 3, which illustrates a cross-sectional view of the sensor package structure according to a third embodiment of the present disclosure. The sensor package structure in the present embodiment as shown in FIG. 3 is similar to the sensor package structure of the second embodiment as shown in FIG. 2. The difference between the present embodiment and the second embodiment is disclosed as follows. The encapsulating compound 4' in the present embodiment is a molding compound. In the present embodiment, a top surface of the encapsulating compound 4' is substantially coplanar with an upper surface 611 of the cover 61. Specifically, the height of the encapsulating compound 4' can be less than or equal to a distance between the upper surface 611 of the cover 61 and the upper surface 11 of the substrate 1. The peripheral side of the encapsulating compound 4' is coplanar with that of the substrate 1. It should be noted that the cover 61 in the present embodiment can be named as a covering portion 61, and the support 62 in the present embodiment can be named as a supporting portion 62.

Fourth Embodiment

Figure 4:
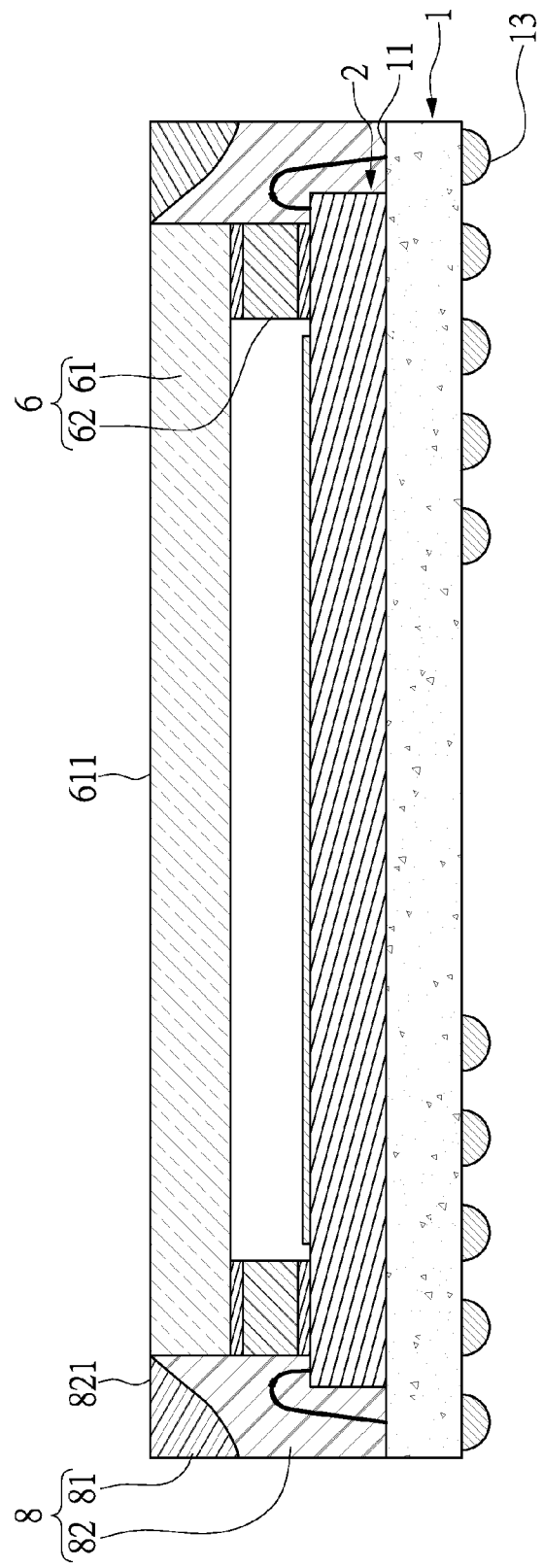
FIG. 4 is a cross-sectional view showing the sensor package structure according to a fourth embodiment of the present disclosure.

Reference is made to FIG. 4, which illustrates a cross-sectional view of the sensor package structure according to a fourth embodiment of the present disclosure. The sensor package structure in the present embodiment as shown in FIG. 4 is similar to the sensor package structure of the second embodiment as shown in FIG. 2. The difference between the present embodiment and the second embodiment is disclosed as follows. The encapsulating compound 8 in the present embodiment includes a first encapsulating compound 81 and a second encapsulating compound 82 disposed on the first encapsulating compound 81. The CTE of the first encapsulating compound 81 is more than that of the second encapsulating compound 82. In the present embodiment, the first encapsulating compound 81 can be a liquid compound, and the second encapsulating compound 82 can be a molding compound. The first encapsulating compound 81 is configured to seal around the substrate 1, the sensing member 2, the cover 61, and the support 62. Moreover, the upper surface 611 of the cover 61 can be higher than or as high as the upper surface 821 of the second encapsulating compound 82. Thus, the first encapsulating compound 81 can be used as a buffer for the shielding member 6, and the second encapsulating compound 82 can be used to reduce the effect generated from stress. It should be noted that the cover 61 in the present embodiment can be named as a covering portion 61, and the support 62 in the present embodiment can be named as a supporting portion 62.

Fifth Embodiment

Figure 5:
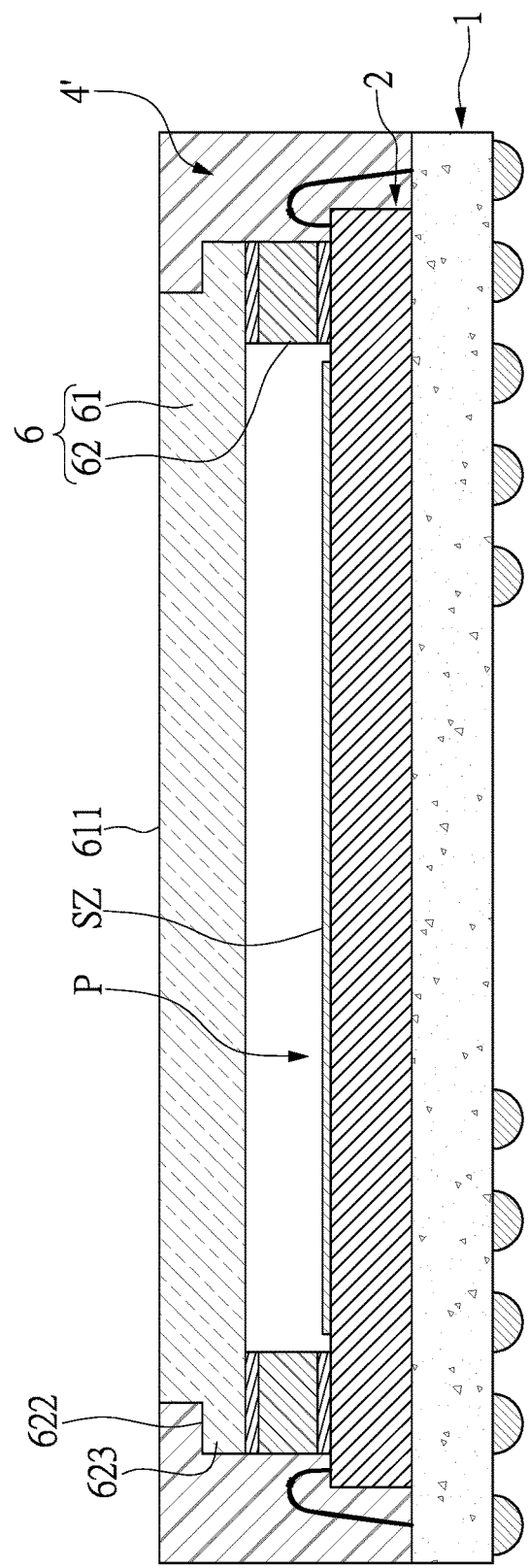
FIG. 5 is a cross-sectional view showing the sensor package structure according to a fifth embodiment of the present disclosure.

Reference is made to FIG. 5, which illustrates a cross-sectional view of the sensor package structure according to a fifth embodiment of the present disclosure. The sensor package structure in the present embodiment as shown in FIG. 5 is similar to the sensor package structure of the third embodiment as shown in FIG. 3. The difference between the present embodiment and the third embodiment is disclosed as follows. The cover 61 in the present embodiment includes a step portion 622 and a bonding portion 623, which are corresponding in position to the support 62. In the present embodiment, the step portion 622 can be formed in an L-shaped notch, the encapsulating compound 4' covers entirely the step portion 622 and the bonding portion 623, and the upper surface of the encapsulating compound 4' can be lower than or as high as the upper surface 611 of the cover 61. It should be noted that the cover 61 in the present embodiment can be named as a covering portion 61, and the support 62 in the present embodiment can be named as a supporting portion 62.

Moreover, a lower part of the peripheral side of the cover 61 is coplanar with the peripheral side of the support 62. At least one notch (i.e., the step portion 622) is recessed on the peripheral side of the cover 61, and the encapsulating compound 4' is filled in the at least one notch. The notch is preferably a ring-like structure formed along the peripheral side of the shielding member 6, but the present disclosure is not limited thereto.

Sixth Embodiment

Figure 6:
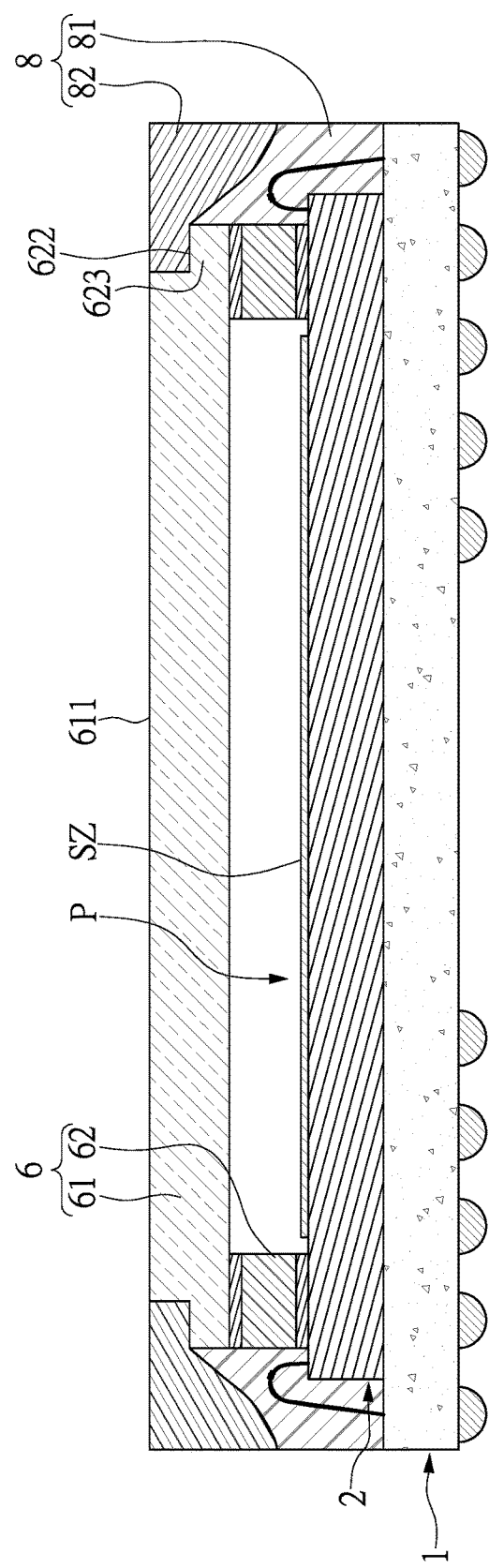
FIG. 6 is a cross-sectional view showing the sensor package structure according to a sixth embodiment of the present disclosure.

Reference is made to FIG. 6, which illustrates a cross-sectional view of the sensor package structure according to a sixth embodiment of the present disclosure. The sensor package structure in the present embodiment as shown in FIG. 6 is similar to the sensor package structure of the fifth embodiment as shown in FIG. 5. The difference between the present embodiment and the fifth embodiment is disclosed as follows. The encapsulating compound 8 in the present embodiment includes a first encapsulating compound 81 and a second encapsulating compound 82 disposed on the first encapsulating compound 81. The first encapsulating compound 81 is configured to seal around the substrate 1, the sensing member 2, the cover 61, and the support 62. The second encapsulating compound 82 is formed on the first encapsulating compound 81. The second encapsulating compound 82 covers entirely the step portion 622 of the cover 61 and is lower than or as high as the upper surface 611 of the cover 61. It should be noted that the cover 61 in the present embodiment can be named as a covering portion 61, and the support 62 in the present embodiment can be named as a supporting portion 62.

Seventh Embodiment

Figure 7:
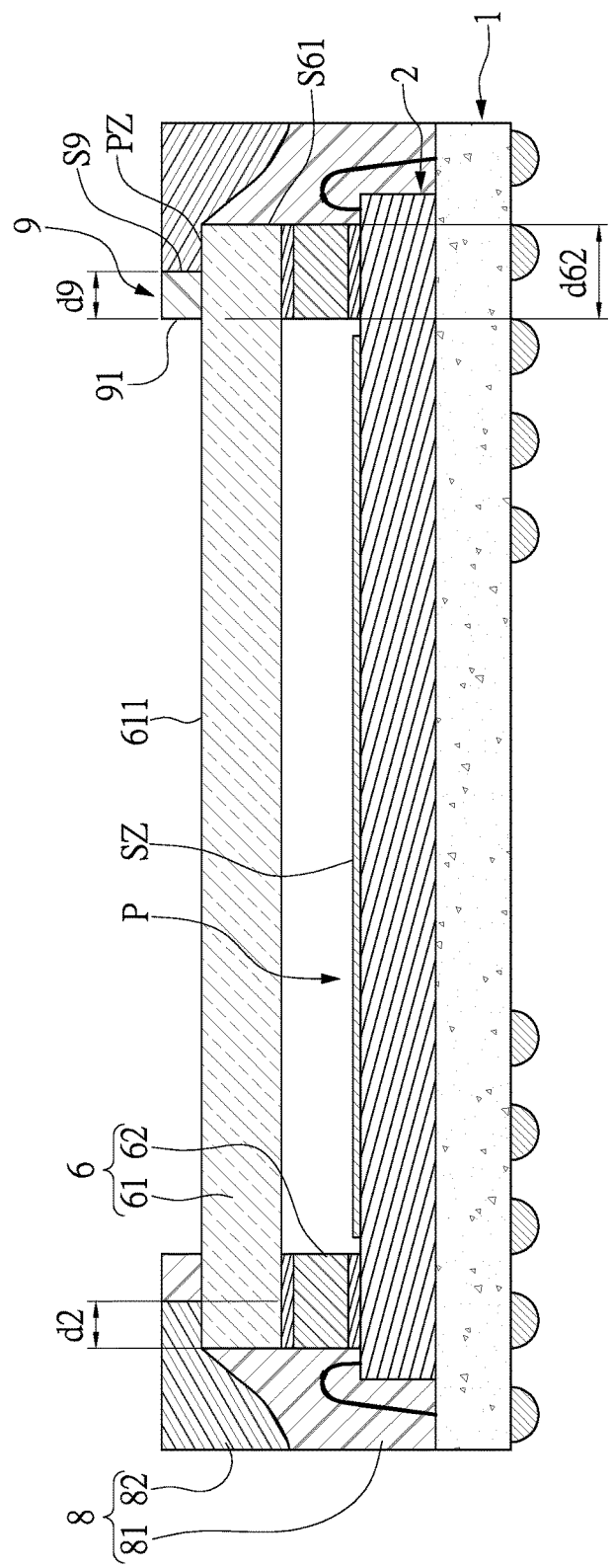
FIG. 7 is a cross-sectional view showing the sensor package structure according to a seventh embodiment of the present disclosure.

Reference is made to FIG. 7, which illustrates a cross-sectional view of the sensor package structure according to a seventh embodiment of the present disclosure. The sensor package structure in the present embodiment as shown in FIG. 7 is similar to the sensor package structure of the sixth embodiment as shown in FIG. 6. The difference between the present embodiment and the sixth embodiment is disclosed as follows. The sensor package structure in the present embodiment further includes a blocking member 9 disposed on the cover 61. The blocking member 9 is arranged above the support 62, and a width d9 of the blocking member 9 is less than a width d62 of the support 62. Specifically, the width d9 of the blocking member 9 is preferably ⅓~½ of the width d62 of the support 62 (i.e., the width d9 can be 0.15~1 mm). Moreover, the blocking member 9 is arranged inside of the peripheral side S61 of the cover 61 by a second predetermined distance d2, and a portion of the upper surface 611 of the cover 61 arranged between the peripheral side S61 of the cover 61 and an outer side S9 of the blocking member 9 is defined as an attaching zone PZ. The second encapsulating compound 82 is formed on the top surface of the first encapsulating compound 81 and covers entirely the attaching zone PZ. The upper surface of the second encapsulating compound 82 can be lower than or as high as the upper surface 91 of the blocking member 9. The first encapsulating compound 81 and the second encapsulating compound 82 can be made of the same material (i.e., the encapsulating compound 4' as shown in FIG. 4), but the present disclosure is not limited thereto. It should be noted that the cover 61 in the present embodiment can be named as a covering portion 61, and the support 62 in the present embodiment can be named as a supporting portion 62.

Moreover, in the present embodiment, the blocking member 9 is substantially in a ring shape, and the attaching zone PZ is arranged in a projecting region defined by orthogonally projecting the support 62 onto the upper surface of the covering portion 61. The first encapsulating compound 81 in the present embodiment is a liquid compound, and the second encapsulating compound 82 is a molding compound. The second encapsulating compound 82 (i.e., the molding compound) is disposed on the top surface of the first encapsulating compound 81 (i.e., the liquid compound) and the attaching zone PZ.

In addition, as shown in FIGS. 5, 6 and 7, the shielding member 6 is formed with a step portion 622, and the encapsulating compound 4' or 8 covers entirely the step portion 622, so that the encapsulating compound 4' or 8 can seal and be firmly fixed on the cover 61 to prevent moisture seeping into the sensing zone SZ, thereby increasing the reliability of packaging process.

Furthermore, in the present disclosure, the CTE of each of the adhesive layer 5, the first adhesive layer 71, and the second adhesive layer 72 can be as the same as or close to the CTE of the encapsulating compound. For example, as shown in FIG. 1, the adhesive layer 5 and the encapsulating compound 4 in the first embodiment can be provided with the same CTE or the similar CTE. As shown in FIG. 3, the first adhesive layer 71 and the second adhesive layer 72 in the third embodiment can be provided with the same CTE or the similar CTE, or the CTE of the first adhesive layer 71 and the second adhesive layer 72 can be as the same as or close to the CTE of the encapsulating compound 4'. Accordingly, when the sensor package structure is heated, the effect of thermal stress on the sensor package structure can be reduced.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A sensor package structure, comprising:
   a substrate having an upper surface and a lower surface opposite to the upper surface, wherein the upper surface of the substrate includes a die bonding zone and a wiring zone arranged outside of the die bonding zone;
   a sensing member mounted on the die bonding zone of the substrate, wherein a top surface of the sensing member arranged distant from the substrate includes a sensing zone, a carrying zone having a ring shape and arranged around the sensing zone, and a connecting zone arranged outside of the carrying zone;
   a shielding member including a translucent covering portion and a ring-shaped supporting portion connected to a peripheral portion of the covering portion, wherein the supporting portion having a coefficient of thermal expansion less than 10 ppm/° C. is fixed on the carrying zone of the sensing member, the shielding member and the top surface of the sensing member surroundingly co-define an enclosed accommodating space, and the sensing zone is arranged in the accommodating space;
   at least one metallic wire having two opposite ends, wherein the two ends of the at least one metallic wire are respectively connected to the wiring zone of the substrate and the connecting zone of the sensing member to establish an electrical connection between the substrate and the sensing member; and
   an encapsulating compound disposed on the wiring zone and covering a peripheral side of the sensing member, the connecting zone, and a peripheral side of the shielding member, wherein the at least one metallic wire is embedded in the encapsulating compound.

2. The sensor package structure as claimed in claim 1, wherein the supporting portion is translucent, the supporting portion and the covering portion have the same coefficient of thermal expansion, and the supporting portion is adhered to or integrally formed on the covering portion.

3. The sensor package structure as claimed in claim 1, wherein a peripheral side of the covering portion does not protrude out of that of the supporting portion.

4. The sensor package structure as claimed in claim 1, wherein the encapsulating compound includes a liquid compound, a top surface of the liquid compound is in an arc shape, and the top surface of the liquid compound and an upper surface of the covering portion are formed with a cut angle within a range of 0~60 degrees.

5. The sensor package structure as claimed in claim 4, further comprising a blocking member, wherein the blocking member is disposed on the upper surface of the covering portion and is arranged inside of the peripheral side of the covering portion by a predetermined distance, a portion of the upper surface of the covering portion arranged between the peripheral side of the covering portion and the blocking member is defined as an attaching zone, and the encapsulating compound further includes a molding compound formed on the top surface of the liquid compound and the attaching zone.

6. The sensor package structure as claimed in claim 5, wherein the attaching zone is arranged in a projecting region defined by orthogonally projecting the supporting portion onto the upper surface of the covering portion, and a width of the supporting portion is within a range of 0.5~2 mm.

7. The sensor package structure as claimed in claim 1, wherein the coefficient of thermal expansion of the supporting portion is within a range of 2.6~7.2 ppm/° C.

8. The sensor package structure as claimed in claim 1, wherein a height of the supporting portion is more than or equal to 300 μm.

9. The sensor package structure as claimed in claim 8, wherein a height of the shielding member is 40~80% of a height of the sensor package structure.

10. A sensor package structure, comprising:
   a substrate having an upper surface and a lower surface opposite to the upper surface, wherein the upper surface of the substrate includes a die bonding zone and a wiring zone arranged outside of the die bonding zone;
   a sensing member having a width more than or equal to 10 mm and mounted on the die bonding zone of the substrate, wherein a top surface of the sensing member arranged distant from the substrate includes a sensing zone, a carrying zone having a ring shape and arranged around the sensing zone, and a connecting zone arranged outside of the carrying zone;
   a shielding member including a translucent covering portion and a ring-shaped supporting portion connected to a peripheral portion of the covering portion, wherein the supporting portion having a height more than or equal to 300 μm is fixed on the carrying zone of the sensing member, the shielding member and the top surface of the sensing member surroundingly co-define an enclosed accommodating space, and the sensing zone is arranged in the accommodating space;
   at least one metallic wire having two opposite ends, wherein the two ends of the at least one metallic wire are respectively connected to the wiring zone of the substrate and the connecting zone of the sensing member to establish an electrical connection between the substrate and the sensing member; and
   an encapsulating compound disposed on the wiring zone and covering a peripheral side of the sensing member, the connecting zone, and a peripheral side of the shielding member, wherein the at least one metallic wire is embedded in the encapsulating compound.

11. The sensor package structure as claimed in claim 10, wherein the supporting portion is translucent, the supporting portion and the covering portion have the same coefficient of thermal expansion, and the supporting portion is adhered to or integrally formed on the covering portion.

12. The sensor package structure as claimed in claim 10, wherein a peripheral side of the covering portion does not protrude out of that of the supporting portion.

13. The sensor package structure as claimed in claim 10, wherein a height of the shielding member is 40~80% of a height of the sensor package structure.

* * * * *